(12) United States Patent
Fujikane et al.

(10) Patent No.: US 12,156,471 B2
(45) Date of Patent: *Nov. 26, 2024

(54) MULTILAYER BODY AND CRYSTALLINE BODY

(71) Applicant: Panasonic Intellectual Property Management Co., Ltd., Osaka (JP)

(72) Inventors: Masaki Fujikane, Osaka (JP); Naoki Tambo, Kyoto (JP); Kunihiko Nakamura, Osaka (JP); Kouhei Takahashi, Osaka (JP); Yasuyuki Naito, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 704 days.

This patent is subject to a terminal disclaimer.

(21) Appl. No.: 17/349,730

(22) Filed: Jun. 16, 2021

(65) Prior Publication Data
US 2021/0313504 A1  Oct. 7, 2021

Related U.S. Application Data

(63) Continuation of application No. PCT/JP2019/037206, filed on Sep. 24, 2019.

(30) Foreign Application Priority Data

Feb. 28, 2019  (JP) .................................. 2019-035361

(51) Int. Cl.
*H01L 35/26* (2006.01)
*H01L 35/32* (2006.01)
(Continued)

(52) U.S. Cl.
CPC ........... *H10N 10/857* (2023.02); *H10N 10/17* (2023.02); *B82Y 20/00* (2013.01)

(58) Field of Classification Search
None
See application file for complete search history.

(56) References Cited

U.S. PATENT DOCUMENTS

| 8,508,370 B1 | 8/2013 | El-Kady et al. |
| 11,917,916 B2 * | 2/2024 | Fujikane ................ H10N 10/17 |

(Continued)

FOREIGN PATENT DOCUMENTS

| JP | 2014-501031 | 1/2014 |
| JP | 2014-166610 | 9/2014 |

(Continued)

OTHER PUBLICATIONS

The Extended European Search Report dated Mar. 15, 2022 for the related European Patent Application No. 19917402.0.

(Continued)

*Primary Examiner* — David Sample
(74) *Attorney, Agent, or Firm* — Rimon P.C.

(57) ABSTRACT

The present disclosure provides a novel multilayer body. The multilayer body of the present disclosure includes a first phononic crystal layer and a second phononic crystal layer disposed on or above the first phononic crystal layer. The first phononic crystal layer has a first phononic crystal structure including a plurality of regularly arranged first through holes. The second phononic crystal layer has a second phononic crystal structure including a plurality of regularly arranged second through holes. The through direction of the plurality of first through holes in the first phononic crystal layer is substantially parallel to the through direction of the plurality of second through holes in the second phononic crystal layer.

11 Claims, 15 Drawing Sheets

(51) Int. Cl.
  *H10N 10/17*    (2023.01)
  *H10N 10/857*   (2023.01)
  *B82Y 20/00*    (2011.01)

(56)         References Cited

U.S. PATENT DOCUMENTS

2009/0295505 A1    12/2009   Mohammadi et al.
2015/0237423 A1*    8/2015   Bahr .................. H03H 9/02566
                                                             381/162
2017/0047499 A1     2/2017   Hussein
2017/0069818 A1     3/2017   Mitrovic et al.
2017/0356806 A1    12/2017   Takahashi et al.
2018/0212131 A1     7/2018   Kikuchi et al.

FOREIGN PATENT DOCUMENTS

JP       2017-223644         12/2017
WO       2012/054777          4/2012
WO       2017/057237          4/2017
WO     WO-2017141682 A1 *     8/2017    ............... G02B 6/12

OTHER PUBLICATIONS

International Search Report of PCT application No. PCT/JP2019/037206 dated Oct. 29, 2019.
Jaeho Lee et al., "Ballistic Phonon Transport in Holey Silicon", Nano Letters 15, Apr. 10, 2015, pp. 3273-3279.
M. Nomura et al., "Impeded thermal transport in Si multiscale hierarchical architectures with phononic crystal nanostructures", Physical Review B 91, May 15, 2015, pp. 205422-1-205422-6.

* cited by examiner

MULTILAYER BODY AND CRYSTALLINE BODY

BACKGROUND

1. Technical Field

The present disclosure relates to a multilayer body including a plurality of layers each having a phononic crystal structure. The present disclosure also relates to a crystalline body having a phononic crystal structure.

2. Description of the Related Art

U.S. Patent Application Publication Nos. 2017/0047499 and 2017/0069818 and Nomura et al., "Impeded thermal transport in Si multiscale hierarchical architectures with phononic crystal nanostructures", Physical Review B 91, 205422 (2015) disclose periodic structures including a plurality of through holes. In these periodic structures, the through holes are regularly arranged in a thin film with a period of the order of nanometers (in the range of 1 nm to 1000 nm) in plan view. Each periodic structure is one type of phononic crystal structure. The phononic crystal structure of such a type is a periodic structure having a through hole arrangement whose minimum unit serves as a unit cell. With this phononic crystal structure, the thermal conductivity, for example, of the thin film can be reduced. The thermal conductivity of a thin film can be reduced by, for example, porosification. This is because the pores introduced into the thin film by the porosification reduce the thermal conductivity of the thin film. However, in the thin film having the phononic crystal structure, the thermal conductivity of the base material itself forming the thin film can be reduced. Therefore, it is expected to further reduce the thermal conductivity of such a thin film as compared with that achieved by simple porosification.

The phononic crystal structure is applicable, for example, to various applications in which low thermal conductivity is advantageous. Japanese Unexamined Patent Application Publication No. 2017-223644 discloses a thermal infrared sensor that uses beams having a phononic crystal structure.

SUMMARY

One non-limiting and exemplary embodiment provides a novel multilayer body.

In one general aspect, the techniques disclosed here feature a multilayer body including: a first phononic crystal layer; and a second phononic crystal layer disposed on or above the first phononic crystal layer, the first phononic crystal layer has a first phononic crystal structure including a plurality of regularly arranged first through holes, wherein the second phononic crystal layer has a second phononic crystal structure including a plurality of regularly arranged second through holes, and wherein a through direction of the plurality of first through holes in the first phononic crystal layer is substantially parallel to a through direction of the plurality of second through holes in the second phononic crystal layer.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Embodiments of the Present Disclosure

Embodiments of the present disclosure will be described with reference to the drawings. The embodiments described below show general or specific examples. Numerical values, shapes, materials, components, arrangements and connections of the components, process conditions, steps, the order of the steps, etc. shown in the following embodiments are merely examples and are not intended to limit the present disclosure. Among the components in the following embodiments, components not described in an independent claim representing the broadest concept will be described as optional components. The drawings are schematic drawings and are not necessarily strictly accurate illustrations.

Figure 1:
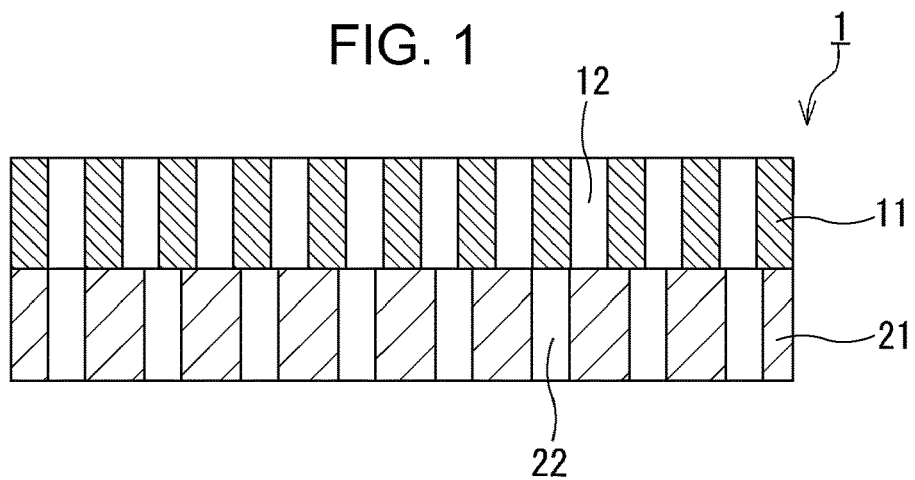
FIG. 1 is a cross-sectional view schematically showing an example of the multilayer body of the present disclosure.
Figure 2A:
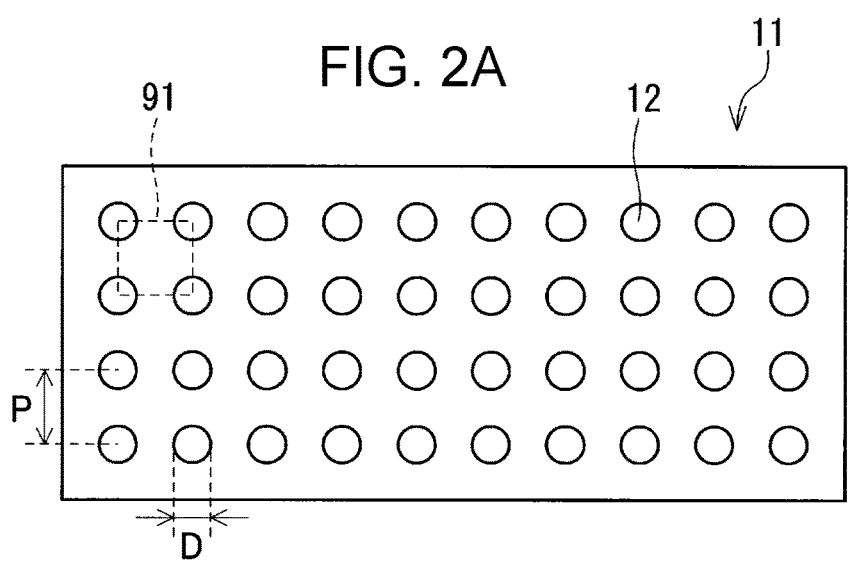
FIG. 2A is a plan view when the multilayer body in FIG. 1 is viewed from a first phononic crystal layer side.
Figure 2B:
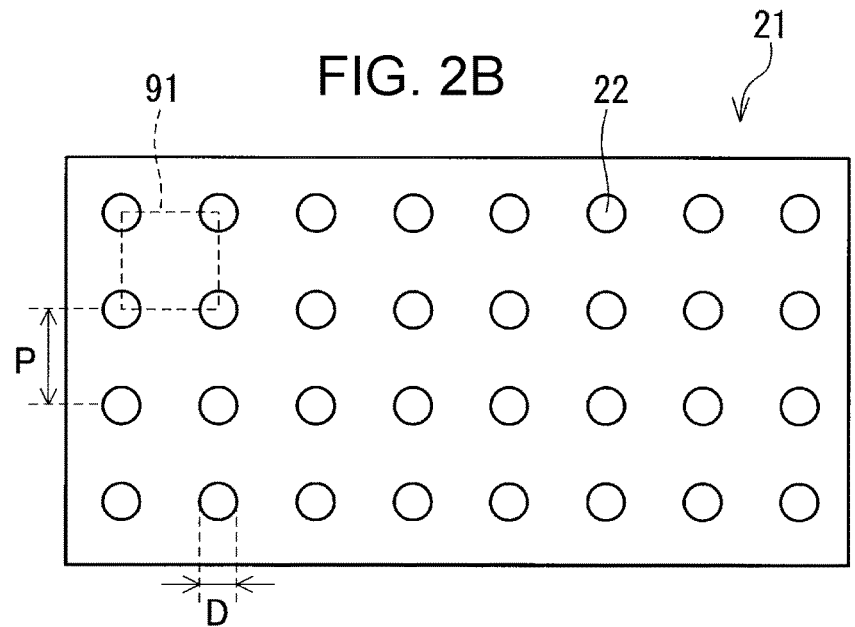
FIG. 2B is a plan view when the multilayer body in FIG. 1 is viewed from a second phononic crystal layer side.

An example of the multilayer body of the present disclosure is shown in FIGS. 1, 2A, and 2B. FIG. 2A is a plan view of the multilayer body 1 in FIG. 1 when it is viewed from a first phononic crystal layer 11 side. FIG. 2B is a plan view of the multilayer body 1 in FIG. 1 when it is viewed from a second phononic crystal layer 21 side. The multilayer body 1 includes a first phononic crystal layer 11 and a second phononic crystal layer 21. The first phononic crystal layer 11 has a first phononic crystal structure including a plurality of regularly arranged first through holes 12. The second phononic crystal layer 21 has a second phononic crystal structure including a plurality of regularly arranged second through holes 22. The through direction of the plurality of first through holes 12 in the first phononic crystal layer 11 is substantially parallel to the through direction of the plurality of second through holes 22 in the second phononic crystal layer 21. The term "substantially parallel" means that the angle between the through direction of the first through holes 12 and the through direction of the second through holes 22 is equal to or more than 0 degrees and equal to or less than 10 degrees when represented by the smaller angle therebetween. The through direction of a through hole is referred to also as the extending direction of the through hole. The first phononic crystal layer 11 is in contact with the second phononic crystal layer 21.

In insulators and semiconductors, heat is transferred mainly by lattice vibrations called phonons. The thermal conductivity of a material composed of an insulator or a semiconductor is determined by the dispersion relation of phonons in the material. The dispersion relation of phonons means the relation between their frequency and wavenumber or the band structure of phonons. In insulators and semiconductors, phonons that transfer heat are present in a wide frequency band of from 100 GHz to 10 THz. This frequency band is a thermal band. The thermal conductivity of a material is determined by the dispersion relation of phonons in the thermal band.

In the above-described phononic crystal structures, the dispersion relation of phonons in the material can be controlled by the periodic structure formed from the through holes. Specifically, in a thin film having a phononic crystal structure, the thermal conductivity itself of the material of the thin film such as its base material can be controlled. In particular, the formation of a phononic band gap (PBG) by the phononic crystal structure can significantly reduce the thermal conductivity of the material. No phonons are allowed to exist in the PBG. Therefore, the PBG located in the thermal band can serve as a gap for thermal conduction. Moreover, in frequency bands other than the PBG, the gradients of the phonon dispersion curves are reduced by the PBG. The reduction in the gradients reduces the group velocity of phonons, causing a reduction in the speed of heat conduction. These characteristics significantly contribute to a reduction in the thermal conductivity of the material.

The PBG is distributed three-dimensionally, and it is expected that a heat flow in the phononic crystal layer can be controlled not only in its in-plane directions but also in its thickness direction. However, conventional monolayer phononic crystal layers having a phononic crystal structure are designed so as to control the heat flow only in in-plane directions. This may be because, in the monolayer phononic crystal layers, a thickness large enough to control the heat flow in the thickness direction cannot be obtained. The aspect ratio of the length of through holes to their diameter that can be achieved by a general semiconductor processing process is at most about 10. This means that it is difficult to stably obtain a monolayer phononic crystal layer having a thickness of, for example, more than 100 nm. However, in the multilayer body of the present disclosure, at least two phononic crystal layers are stacked in their thickness direction. It is expected that the stack with an increased thickness will allow the heat flow in the thickness direction to be controlled. The multilayer body of the present disclosure is applicable to applications in which, for example, the heat flow is controlled in the thickness direction of the phononic crystal layer.

The thickness of the first phononic crystal layer 11 and the thickness of the second phononic crystal layer 21 are, for example, equal to or more than 10 nm and equal to or less than 500 nm. The thickness of the first phononic crystal layer 11 and the thickness of the second phononic crystal layer 21 may be the same or different.

The first phononic crystal structure that the first phononic crystal layer 11 has and the second phononic crystal structure that the second phononic crystal layer 21 has may be structurally the same or different. When the first phononic crystal structure structurally differs from the second phononic crystal structure, at least part of the second through holes 22 are generally not in communication with the first through holes 12. In the multilayer body 1 shown in FIGS. 1, 2A, and 2B, the first phononic crystal structure structurally differs from the second phononic crystal structure. Specifically, the period P of the arrangement of the first through holes 12 differs from the period P of the arrangement of the second through holes 22.

Examples of the case where the first phononic crystal structure structurally differs from the second phononic crystal structure include the following cases. A plurality of cases may be used in combination.

The period P of the arrangement of the first through holes 12 differs from the period P of the arrangement of the second through holes 22.

The diameter D of the first through holes 12 differs from the diameter D of the second through holes 22.

The type of unit cell 91 including first through holes 12 differs from the type of unit cell 91 including second through holes 22.

When the first phononic crystal structure structurally differs from the second phononic crystal structure, a portion of the second phononic crystal structure that is obtained by removing the second through holes 22 from the second phononic crystal structure is partially in contact with the first through holes 12 at the boundary surface between the first phononic crystal layer 11 and the second phononic crystal layer 21. This portion does not contribute to electric conduction. The larger the area of this portion, the higher the electrical resistance of the multilayer body. As described above, part of the portion of the second phononic crystal structure that is obtained by removing the second through holes 22 from the second phononic crystal structure is in contact with the first through holes 12. For example, when the ratio of the total area of the part of the above portion that is in contact with the first through holes 12 to the total area of the above portion is 20%, the electrical resistance is higher by 25% than that when the ratio is 0%. When the ratio is 15%, the increase in the electrical resistance is 18%. The ratio is preferably equal to or less than 16.7%. In this case, the rate of the increase in electrical resistance can be as low as 20% or less. The ratio is more preferably equal to or less than 9.1%. In this case, the rate of the increase in electrical resistance can be as low as 10% or less.

As shown in a phononic crystal structure A described later, the arrangement of the first through holes 12 in the first phononic crystal structure and the arrangement of the second through holes 22 in the second phononic crystal structure are not always constant over the entire phononic crystal layers. In consideration of the above, when the first phononic crystal structure structurally differs from the second phononic crystal structure, the multilayer body of the present disclosure can have the following configurations. The multilayer body of the present disclosure may have a configuration obtained by combining any of the following configurations.

Configuration A: The first phononic crystal structure includes a first domain that is a phononic crystal region. The second phononic crystal structure includes a second domain that is a phononic crystal region. The first domain and the second domain overlap each other, when the multilayer body is viewed in the through direction of the first through holes 12 or the second through holes 22. A period P of the arrangement of the first through holes 12 in the first domain differs from a period of the arrangement of the second through holes 22 in the second domain.

Configuration B: The first phononic crystal structure includes a first domain that is a phononic crystal region. The second phononic crystal structure includes a second domain that is a phononic crystal region. The first domain and the second domain overlap each other, when the multilayer body is viewed in the through direction of the first through holes 12 or the second through holes 22. A diameter of the first through holes 12 in the first domain differs from a diameter of the second through holes 22 in the second domain.

Configuration C: The first phononic crystal structure includes a first domain that is a phononic crystal region. The second phononic crystal structure includes a second domain that is a phononic crystal region. The first domain and the second domain overlap each other, when the multilayer body is viewed in the through direction of the first through holes 12 or the second through holes 22. A type of unit cell including first through holes 12 in the first domain differs from a type of unit cell including second through holes 22 in the second domain.

Each of the domains, which are phononic crystal regions, is a region having an area of, for example, equal to or more than $25P^2$ in plan view, where P is the period of the arrangement of the through holes 12 or 22. To control the dispersion relation of phonons using the phononic crystal structure, the domain may have an area of at least equal to or more than $25P^2$. When the period of a square domain in plan view is equal to or more than $5 \times P$, the area of the domain can be equal to or more than $25P^2$.

No limitation is imposed on the shape of each domain in plan view. The shape of each domain in plan view is, for example, a polygonal shape such as a triangular, square, or rectangular shape, a circular shape, an elliptical shape, or a combination thereof. Each domain may have an irregular shape in plan view. No limitation is imposed on the number of domains included in each phononic crystal structure. No limitation is imposed on the size of each domain included in the phononic crystal structure. One domain may be spread over the entire phononic crystal layer.

In the present specification, the term "in plan view" means that an object is viewed in the through direction of the through holes included in the phononic crystal structure. When the object has a thin film shape, the through direction of the through holes is typically a direction substantially perpendicular to a principal surface of the object. The "principal surface" is the surface having a largest area.

The period P of the arrangement of the through holes 12 or 22 is, for example, equal to or more than 1 nm and equal to or less than 300 nm. This is because the wavelength of phonons carrying heat ranges mainly from 1 nm to 300 nm. The period P is determined by the center-to-center distance between adjacent through holes 12 or 22 in plan view.

The diameter D of the through holes 12 or 22 satisfies, for example, $D/P \geq 0.5$, where $D/P$ is the ratio of the diameter D to the period P. If the ratio $D/P<0.5$, the porosity of the phononic crystal structure is excessively small, so that the heat flow may not be controlled sufficiently, e.g., the thermal conductivity may not be sufficiently reduced. The upper limit of the ratio D/P is, for example, less than 0.9 in order to prevent contact between adjacent through holes 12 or 22. The diameter D of the through holes 12 or 22 is the diameter of their openings. When the openings of the through holes 12 or 22 have a circular shape in plan view, the diameter D is the diameter of the circular shape. The openings of the through holes 12 or 22 may have a non-circular shape in plan view. In this case, the diameter D is defined as the diameter of a virtual circle having the same area as the area of the openings.

Figure 3A:
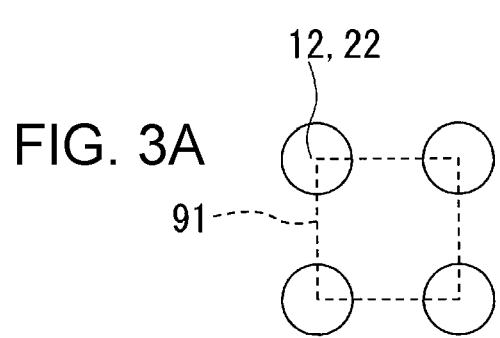
FIG. 3A is a schematic illustration showing an example of a unit cell of a phononic crystal structure that the multilayer body of the present disclosure can have.
Figure 3B:
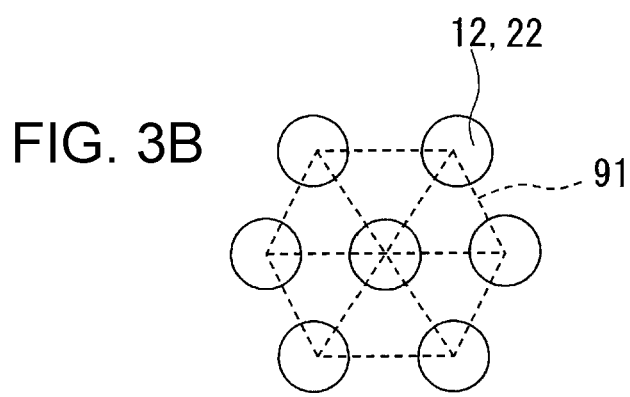
FIG. 3B is a schematic illustration showing another example of the unit cell of the phononic crystal structure that the multilayer body of the present disclosure can have.
Figure 3C:
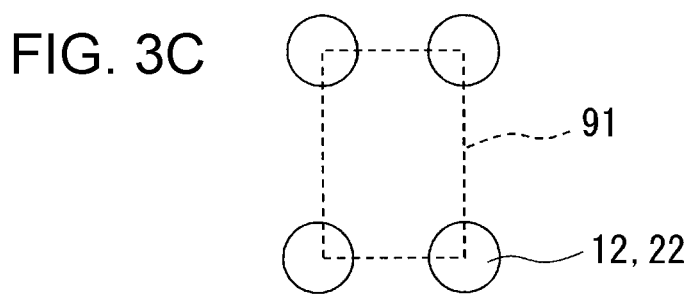
FIG. 3C is a schematic illustration showing another example of the unit cell of the phononic crystal structure that the multilayer body of the present disclosure can have.
Figure 3D:
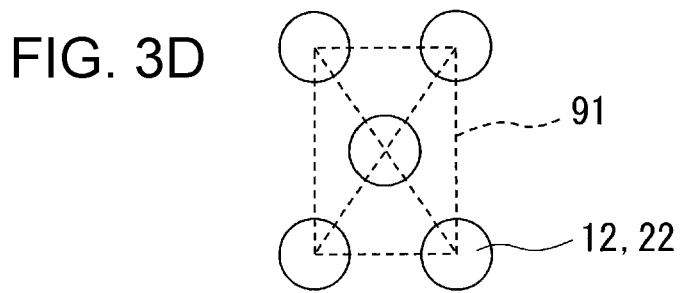
FIG. 3D is a schematic illustration showing another example of the unit cell of the phononic crystal structure that the multilayer body of the present disclosure can have.

Examples of the type of unit cell 91 including a plurality of regularly arranged through holes 12 or 22 include a square lattice (FIG. 3A), a hexagonal lattice (FIG. 3B), a rectangular lattice (FIG. 3C), and a centered rectangular lattice (FIG. 3D). However, the type of unit cell 91 is not limited to these examples.

The first phononic crystal layer 11 and the second phononic crystal layer 21 are typically formed of a semiconductor material. The semiconductor material is, for example, silicon (Si), Ge, SiGe, SiC, ZnSe, CdSn, ZnO, GaAs, InP, or GaN. The material forming the first phononic crystal layer 11 and the second phononic crystal layer 21 may be a material other than the semiconductor material, and examples of such a material include TiN, SiN, and $VO_2$. However, the material forming the first phononic crystal layer 11 and the second phononic crystal layer 21 is not limited to these examples.

The multilayer body of the present disclosure may have the following configuration. The first phononic crystal structure includes a third domain and a fourth domain that are phononic crystal regions. The third domain includes a plurality of first through holes 12 that are regularly arranged in a first direction in a cross section perpendicular to the through direction of the first through holes 12. The fourth domain includes a plurality of first through holes 12 that are regularly arranged in a second direction different from the first direction in the cross section perpendicular to the through direction of the first through holes 12. The second phononic crystal structure includes a fifth domain and a sixth domain that are phononic crystal regions. The fifth domain includes a plurality of second through holes 22 that are regularly arranged in a third direction in a cross section perpendicular to the through direction of the second through holes 22. The sixth domain includes a plurality of second through holes 22 that are regularly arranged in a fourth direction different from the third direction in the cross section perpendicular to the through direction of the second through holes 22. The phononic crystal structure including a plurality of domains including respective through holes 12 and 22 with different orientations as described above is referred to as a phononic crystal structure A.

According to studies by the present inventors, the degree of reduction in thermal conductivity obtained by a phononic crystal structure depends on the angle between the direction of heat transfer and the orientation of the unit cell of the phononic crystal structure. This may be because factors relating to heat conduction such as the number of PBGs, the band width of each PBG, the average group velocity of phonons depend on the above angle. As for heat transfer, phonons flow in a direction from a high temperature side to a low temperature side in a macroscopic sense. When attention is focused on micro-regions of the order of nanometers, the flow of phonons has no directivity. Specifically, phonons do not flow in a uniform direction in a microscopic sense.

U.S. Patent Application Publication Nos. 2017/0047499 and 2017/0069818 and Nomura et al., "Impeded thermal transport in Si multiscale hierarchical architectures with phononic crystal nanostructures", Physical Review B 91, 205422 (2015) disclose members each having a plurality of phononic crystal regions with the same unit cell orientation. In these members, their interaction with phonons flowing in a specific direction is maximized in a microscopic sense, but the interaction with phonons flowing in the other directions is weakened. The phononic crystal structure A includes two or more phononic crystal regions with different unit cell directions. Therefore, the interaction with phonons flowing in a plurality of directions can be enhanced in a microscopic sense. This feature allows the flexibility in controlling the heat flow to be further improved.

The following description relates to the phononic crystal structure A that the first phononic crystal layer 11 and/or the second phononic crystal layer 21 can have. The phononic crystal structure A that the first phononic crystal layer 11 has and the phononic crystal structure A that the second phononic crystal layer 21 has may be structurally the same or different.

Figure 4:
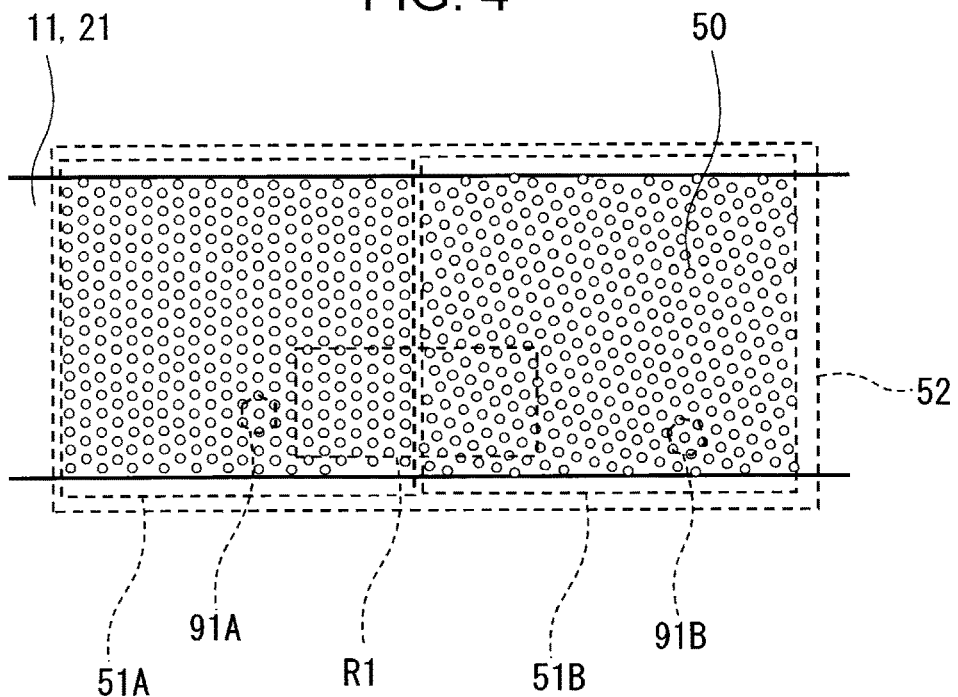
FIG. 4 is a plan view schematically showing an example of the phononic crystal structures that the multilayer body of the present disclosure can have.

An example of the phononic crystal structure A is shown in FIG. 4. FIG. 4 shows a plan view of part of the first phononic crystal layer 11 or the second phononic crystal layer 21. The phononic crystal layer 11 or 21 is a thin film having a thickness of, for example, equal to or larger than 10 nm and equal to or less than 500 nm. The phononic crystal layer 11 or 21 is rectangular in plan view. A plurality of through holes 50 extending in the thickness direction of the phononic crystal layer 11 or 21 are provided in the phononic crystal layer 11 or 21. The phononic crystal structure A that the phononic crystal layer 11 or 21 has is a two-dimensional phononic crystal structure in which the plurality of through holes 50 are regularly arranged in in-plane directions. In the following description of the phononic crystal structure A, when the crystal layer having the phononic crystal structure A is the second phononic crystal layer 21, the "third domain" is replaced with the "fifth domain," and the "fourth domain" is replaced with the "sixth domain."

The phononic crystal structure A includes the third domain 51A that is a phononic crystal region and the fourth domain 51B that is a phononic crystal region. The third domain 51A has a phononic single crystal structure including a plurality of through holes 50 arranged regularly in a first direction in plan view. The fourth domain 51B has a phononic single crystal structure including a plurality of through holes 50 arranged regularly in a second direction different from the first direction in plan view. In each of the single crystal structures, the plurality of through holes 50 have the same diameter and arranged with the same period. In each of the single crystal structures, the orientations of unit cells 91A or 91B each including a plurality of regularly arranged through holes 50 are the same. The third domain 51A and the fourth domain 51B each have a rectangular shape in plan view. The shape of the third domain 51A and the shape of the fourth domain 51B are the same in plan view. The phononic crystal structure A is also a phononic polycrystal structure 52 that is a complex body including a plurality of phononic single crystal structures.

Figure 5A:
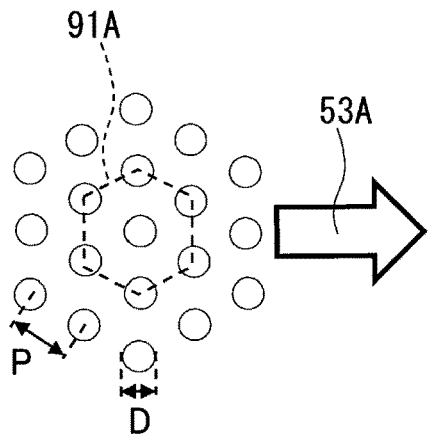
FIG. 5A is a schematic illustration showing a unit cell of a first domain included in one of the phononic crystal structures in FIG. 4 and the orientation of the unit cell.
Figure 5B:
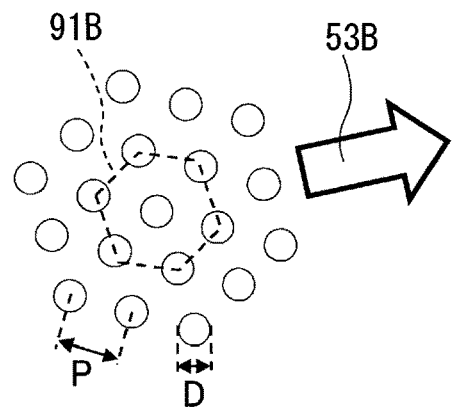
FIG. 5B is a schematic illustration showing a unit cell of a second domain included in another one of the phononic crystal structures in FIG. 4 and the orientation of the unit cell.

As shown in FIGS. 5A and 5B, in the phononic crystal structure A, the orientation 53A of each unit cell 91A in the third domain 51A differs from the orientation 53B of each unit cell 91B in the fourth domain 51B in plan view. The angle between the orientation 53A and the orientation 53B in plan view is, for example, equal to or more than 10 degrees. When the unit cell 91A and the unit cell 91B are identical and have an n-fold rotational symmetry, the upper limit of the angle between the orientation 53A and the orientation 53B is less than 360/n degrees. When each unit cell has n-fold symmetries for a plurality of n's, the largest one of the n's is used to determine the upper limit of the angle. For example, a hexagonal lattice has a 2-fold rotational symmetry, a 3-fold rotational symmetry, and a 6-fold rotational symmetry. In this case, "6" is used for the n defining the upper limit of the angle. Specifically, when the unit cells 91A and 91B are each a hexagonal lattice, the angle between the orientation 53A and the orientation 53B is less than 60 degrees. The phononic crystal structure A includes at least two phononic crystal regions having different unit cell orientations. The phononic crystal structure A may further include any other phononic crystal regions and/or regions having no phononic crystal structure so long as the above condition is met.

The orientation of a unit cell can be determined based on any rule. However, it is necessary that the same rule be applied to different domains to determine the orientations of their unit cells. The orientation of a unit cell is, for example, the extending direction of a straight line bisecting the angle between two non-parallel sides included in the unit cell. However, it is necessary to use the same rule for different domains to define their two sides.

Figure 6:
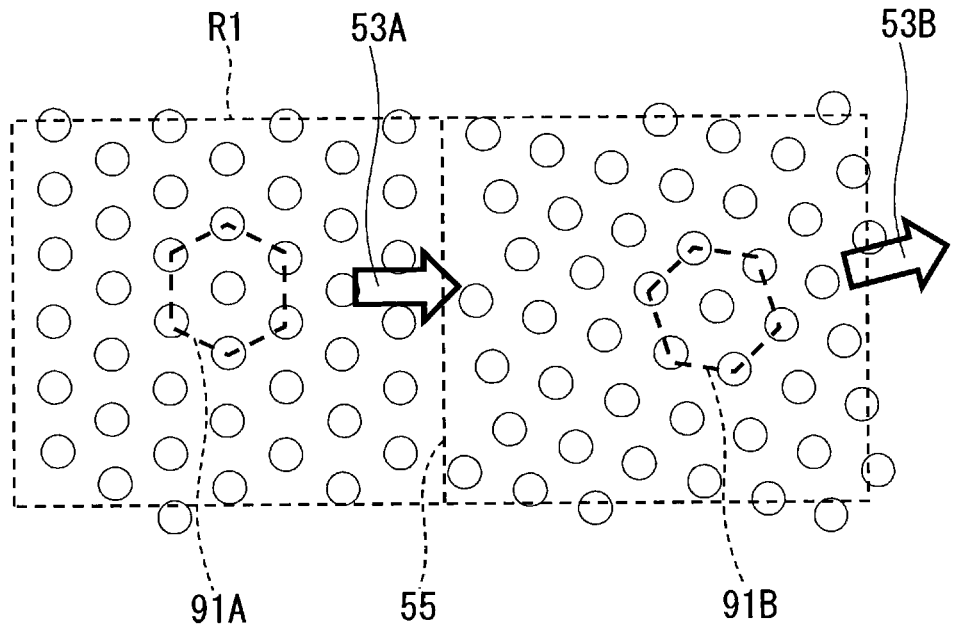
FIG. 6 is an enlarged view of region R1 in the phononic crystal structures in FIG. 4.

FIG. 6 shows an enlarged view of region R1 in the phononic crystal structure A in FIG. 4. The orientations 53A and 53B of the unit cells 91A and 91B change at the interface 55 between the third domain 51A and the fourth domain 51B adjacent to each other. The interface 55 at which the orientations of the unit cells change has a large interface resistance to heat macroscopically flowing through the phononic crystal structure A. The interface resistance is based on a mismatch between the group velocity of phonons in the third domain 51A and the group velocity of phonons in the fourth domain 51B. The interface resistance contributes to a reduction in the thermal conductivity of the phononic crystal layer 11 or 21 having the phononic crystal structure A. In FIG. 6, the interface 55 extends linearly in plan view. The interface 55 extends in the width direction of the rectangular phononic crystal layer 11 or 21 in plan view. The width direction may be a direction perpendicular to the extending direction of the centerline of the phononic crystal layer 11 or 21 that is determined by the direction of macroscopic heat transfer. The interface 55 divides the phononic crystal structure A in a direction substantially perpendicular to the direction of macroscopic heat transfer in plan view.

In the phononic crystal structure A in FIG. 4, the period P of the arrangement of the plurality of through holes 50 in the third domain 51A is the same as the period P of the arrangement of the plurality of through holes 50 in the fourth domain 51B.

In the phononic crystal structure A in FIG. 4, the diameter of the plurality of through holes 50 regularly arranged in the third domain 51A is the same as the diameter of the plurality of through holes 50 regularly arranged in the fourth domain 51B.

In the phononic crystal structure A in FIG. 4, the type of unit cell 91A in the third domain 51A is the same as the type of unit cell 91B in the fourth domain 51B. The unit cell 91A and the unit cell 91B in FIG. 4 are each a hexagonal lattice.

No limitation is imposed on the number of domains included in the phononic crystal structure A. The larger the number of domains included in the phononic crystal structure A, the larger the effect of the interface resistance at the interfaces between domains.

Examples of the phononic crystal structure A will be shown.

Figure 7:
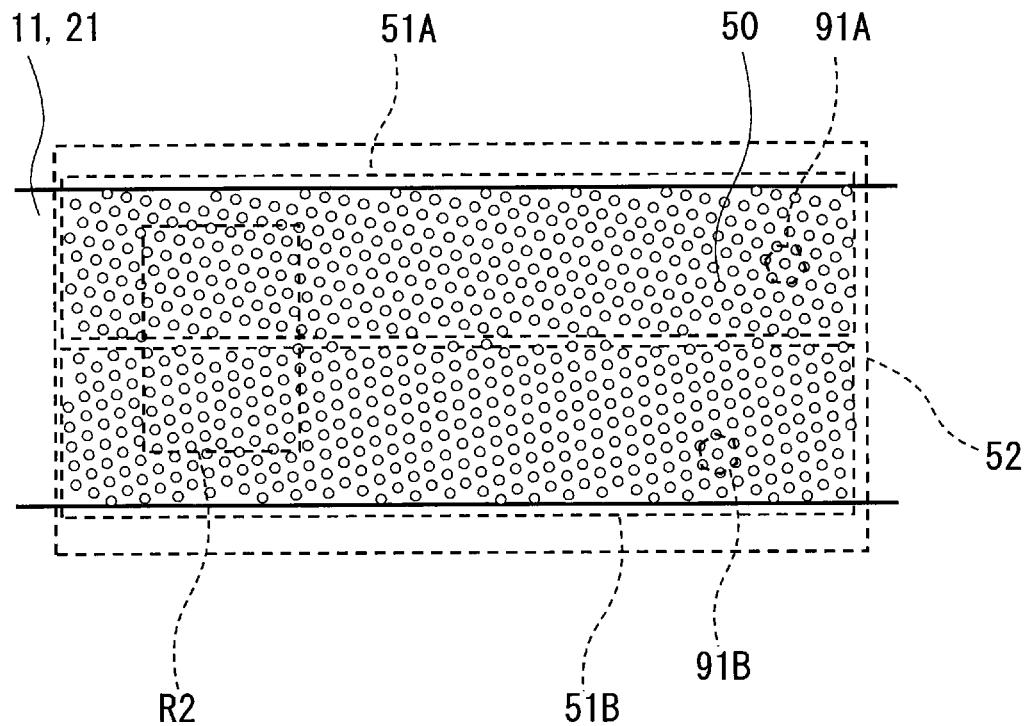
FIG. 7 is a plan view schematically showing another example of the phononic crystal structures that the multilayer body of the present disclosure can have.
Figure 8:
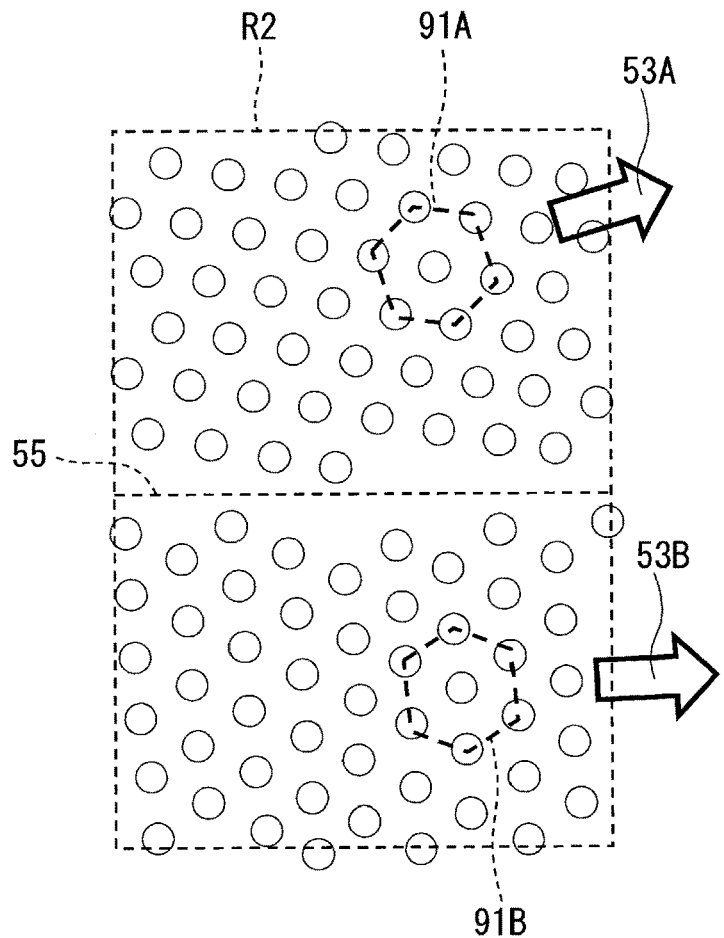
FIG. 8 is an enlarged view of region R2 in the phononic crystal structures in FIG. 7.

In a polycrystal structure 52 that is a phononic crystal structure A in FIGS. 7 and 8, the interface 55 between a third domain 51A and a fourth domain 51B adjacent to each other extends in the direction of the long sides of the rectangular phononic crystal layer 11 or 21 in plan view. The direction of the long sides can be the direction of macroscopic heat transfer. The phononic crystal structure A in FIGS. 7 and 8 is structurally the same as the phononic crystal structure A in FIG. 4 except for the above feature. The interface 55 divides the phononic crystal structure A in a direction substantially parallel to the direction of macroscopic heat transfer in plan view. FIG. 8 is an enlarged view of region R2 in FIG. 7.

In the phononic crystal structures A in FIGS. 4 and 7, the size of the third domain 51A is the same as the size of the fourth domain 51B in plan view. However, the sizes of the third and fourth domains 51A and 51B included in a phononic structure A may differ from each other in plan view.

Figure 9:
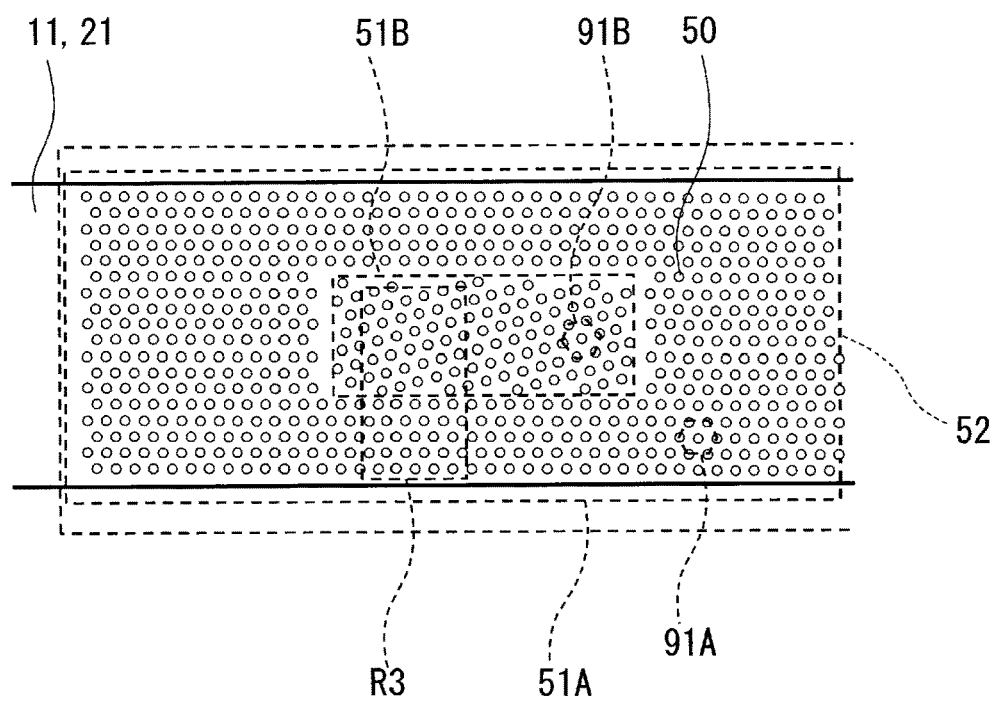
FIG. 9 is a plan view schematically showing another example of the phononic crystal structures that the multilayer body of the present disclosure can have.
Figure 10:
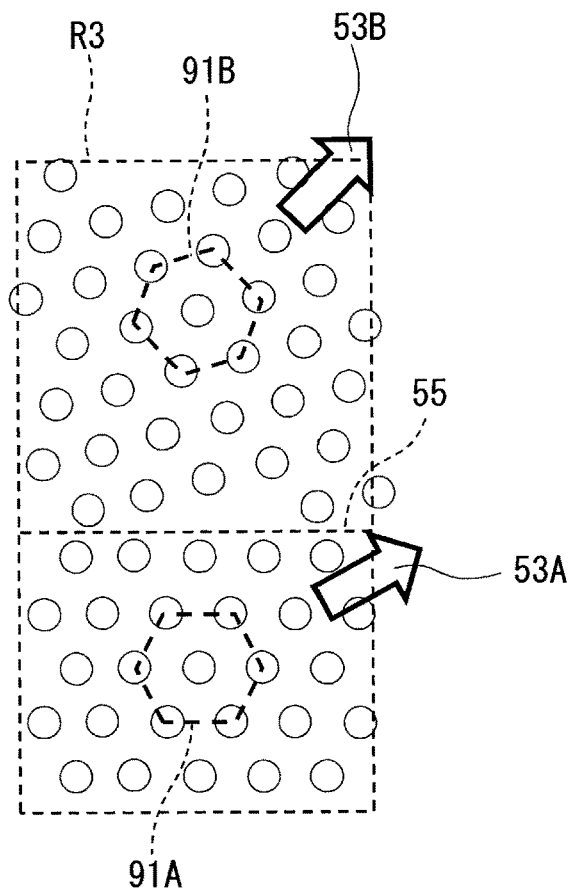
FIG. 10 is an enlarged view of region R3 in the phononic crystal structures in FIG. 9.

In a polycrystal structure 52 that is a phononic crystal structure A in FIGS. 9 and 10, a third domain 51B is surrounded by a fourth domain 51A in plan view. The third domain 51A and the fourth domain 51B each have a rectangular shape in plan view. However, the size of the third domain 51A differs from the size of the fourth domain 51B in plan view. In plan view, the interface 55 between the fourth domain 51B and the third domain 51A surrounding the fourth domain 51B forms the outer edge of the fourth domain 51B. The phononic crystal structure A in FIGS. 9 and 10 is structurally the same as the phononic crystal structure A in FIG. 4 except for the above feature. FIG. 10 is an enlarged view of region R3 in FIG. 9.

In the phononic crystal structure A in FIGS. 9 and 10, the interface 55 has bent portions.

Moreover, the phononic crystal structure A in FIGS. 9 and 10 includes the fourth domain 51B that is not in contact with the sides of the phononic crystal layer 11 or 21.

Figure 11:
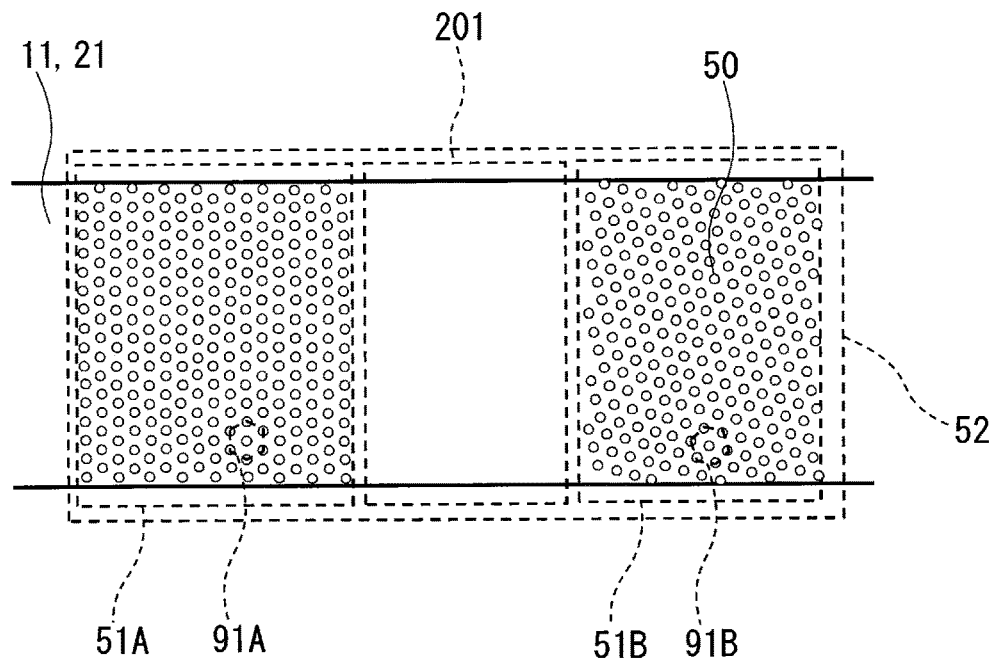
FIG. 11 is a plan view schematically showing yet another example of the phononic crystal structures that the multilayer body of the present disclosure can have.

In a polycrystal structure 52 that is a phononic crystal structure A in FIG. 11, a third domain 51A and a fourth domain 51B are disposed so as to be spaced apart from each other in plan view. More specifically, in plan view, a region 201 having no through holes 50 is disposed between the third domain 51A and the fourth domain 51B so as to extend in the long side direction of the phononic crystal layer 11 or 21. The phononic crystal structure A in FIG. 11 is structurally the same as the phononic crystal structure A in FIG. 4 except for the above feature.

Figure 12:
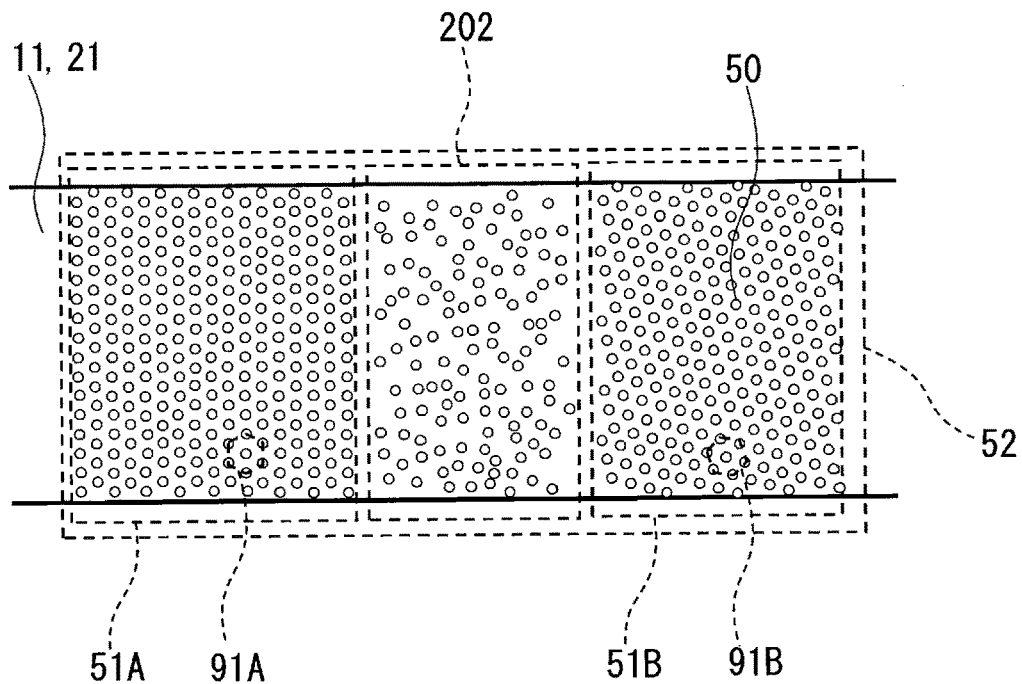
FIG. 12 is a plan view schematically showing still another example of the phononic crystal structures that the multilayer body of the present disclosure can have.

In a polycrystal structure 52 that is a phononic crystal structure A in FIG. 12, a third domain 51A and a fourth domain 51B are disposed so as to be spaced apart from each other in plan view. More specifically, in plan view, a region 202 having randomly arranged through holes 50 is disposed between the third domain 51A and the fourth domain 51B so as to extend in the long side direction of the phononic crystal layer 11 or 21. In the region 202, the through holes 50 are not arranged regularly in plan view. Alternatively, in the region 202, the area of a regular arrangement region is, for example, less than $25P^2$ in plan view. Here, P is the period of the arrangement of the through holes 50. The phononic crystal structure A in FIG. 12 is structurally the same as the phononic crystal structure A in FIG. 4 except for the above feature.

Figure 13:
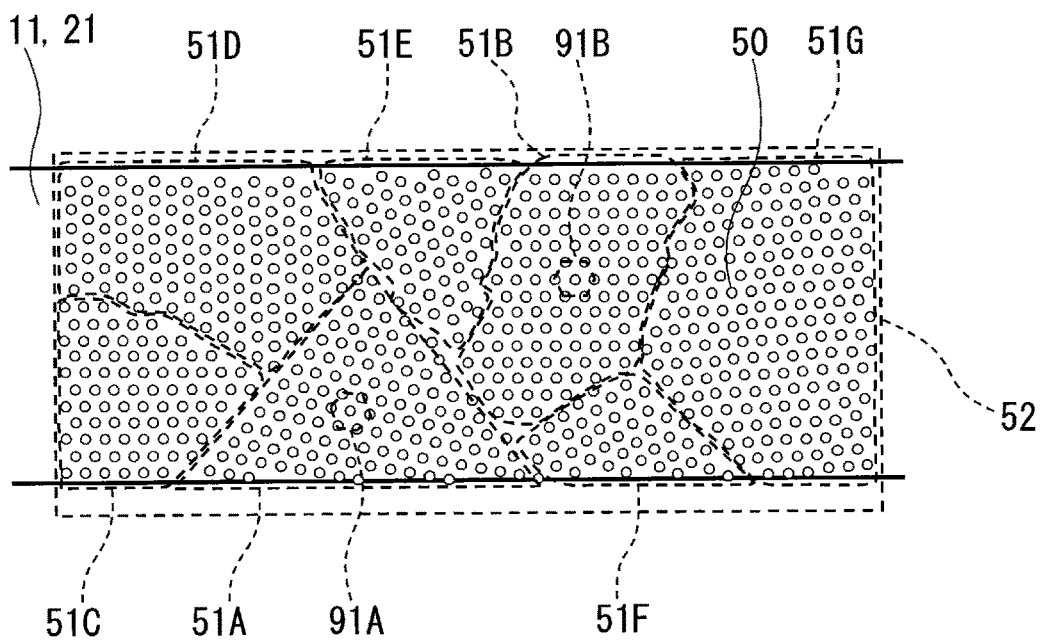
FIG. 13 is a plan view schematically showing still another example of the phononic crystal structures that the multilayer body of the present disclosure can have.

A polycrystal structure 52 that is a phononic crystal structure A in FIG. 13 includes a plurality of domains 51A to 51G having different shapes in plan view. In each of the domains, the period of the arrangement of a plurality of through holes 50 and the unit cell orientation are constant. However, the unit cell orientations of the domains 51A to 51G differ from each other. In plan view, the sizes and shapes of the domains 51A to 51G differ from each other. In this configuration, the number of unit cell orientations in the phononic crystal structure A as a whole is larger than that in the configurations exemplified above. Therefore, the effect of reducing the thermal conductivity that is based on the difference in unit cell orientation between domains is more significant. In this configuration, interfaces 55 between the domains extend in a plurality of random directions in plan view. Therefore, the effect of reducing the thermal conductivity based on the interface resistance is more significant.

In the phononic crystal structure A in FIG. 13, the interface 55 between the third domain 51A and the fourth domain 51B adjacent to each other extends in a direction inclined with respect to the width direction of the phononic crystal layer 11 or 21 in plan view. The interfaces 55 also have bent portions in plan view.

Figure 14A:
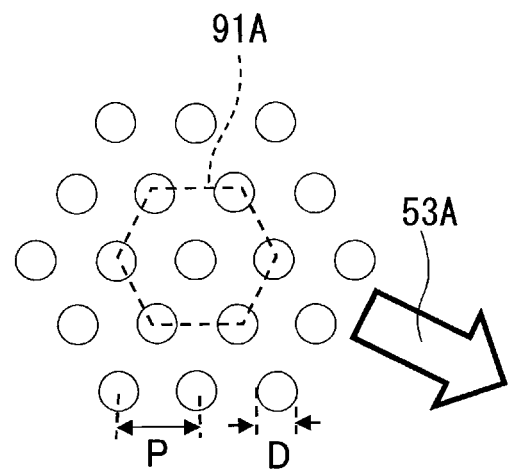
FIG. 14A is a schematic illustration showing an example of the unit cell of the phononic crystal structure that the multilayer body of the present disclosure can have.
Figure 14B:
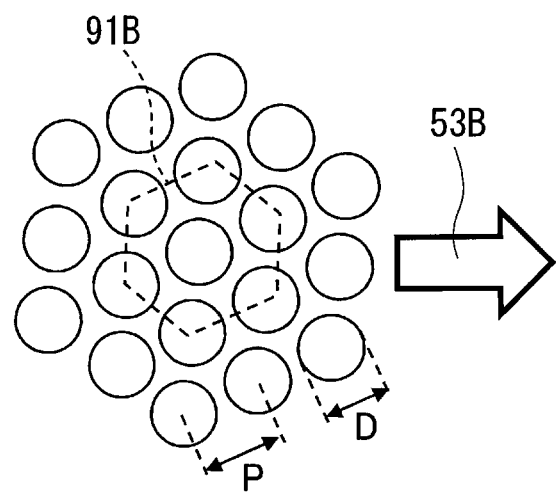
FIG. 14B is a schematic illustration showing another example of the unit cell of the phononic crystal structure that the multilayer body of the present disclosure can have.

A polycrystal structure 52 that is a phononic crystal structure A may include a third domain 51A and a fourth domain 51B that differ in the period P of the arrangement of through holes 50 and/or in the diameter D of the through holes 50. The diameter D of through holes 50 in a third domain 51A shown in FIG. 14A differs from the diameter D of through holes 50 in a fourth domain 51B shown in FIG. 14B. The period P of the arrangement of the through holes 50 in the third domain 51A shown in FIG. 14A is the same as the period P of the arrangement of the through holes 50 in the fourth domain 51B shown in FIG. 14B.

Figure 15:
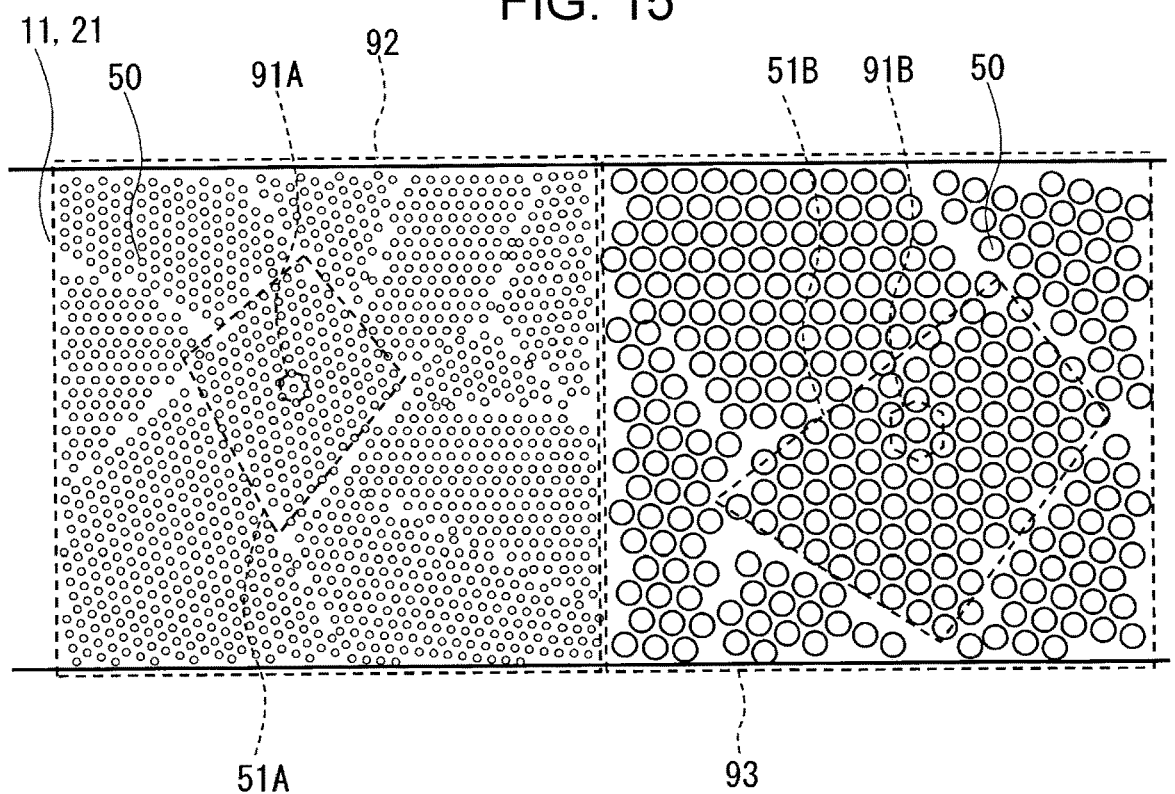
FIG. 15 is a plan view schematically showing still another example of the phononic crystal structures that the multilayer body of the present disclosure can have.

A phononic crystal structure A shown in FIG. 15 has a third domain 51A in which a plurality of through holes 50 having a smaller diameter D are regularly arranged with a smaller period P and a fourth domain 51b in which a plurality of through holes 50 having a larger diameter D are regularly arranged with a larger period P. The phononic crystal structure A shown in FIG. 15 includes a region 92 including a plurality of through holes 50 with a smaller period P and a smaller diameter D and a region 93 including a plurality of through holes 50 with a larger period P and a larger diameter D. The region 92 is adjacent to the region 93. The region 92 and the region 93 each include a plurality of domains having different shapes and different unit cell orientations in plan view, as in the example shown in FIG. 13. The interface between the region 92 and the region 93 divides the phononic crystal structure A in a direction substantially perpendicular to the direction of macroscopic heat transfer. In this configuration, the frequency band of a phononic band gap formed in the third domain 51A differs from the frequency band of a phononic band gap formed in the fourth domain 51B, and therefore the effect of reducing the thermal conductivity is particularly significant.

Figure 16:
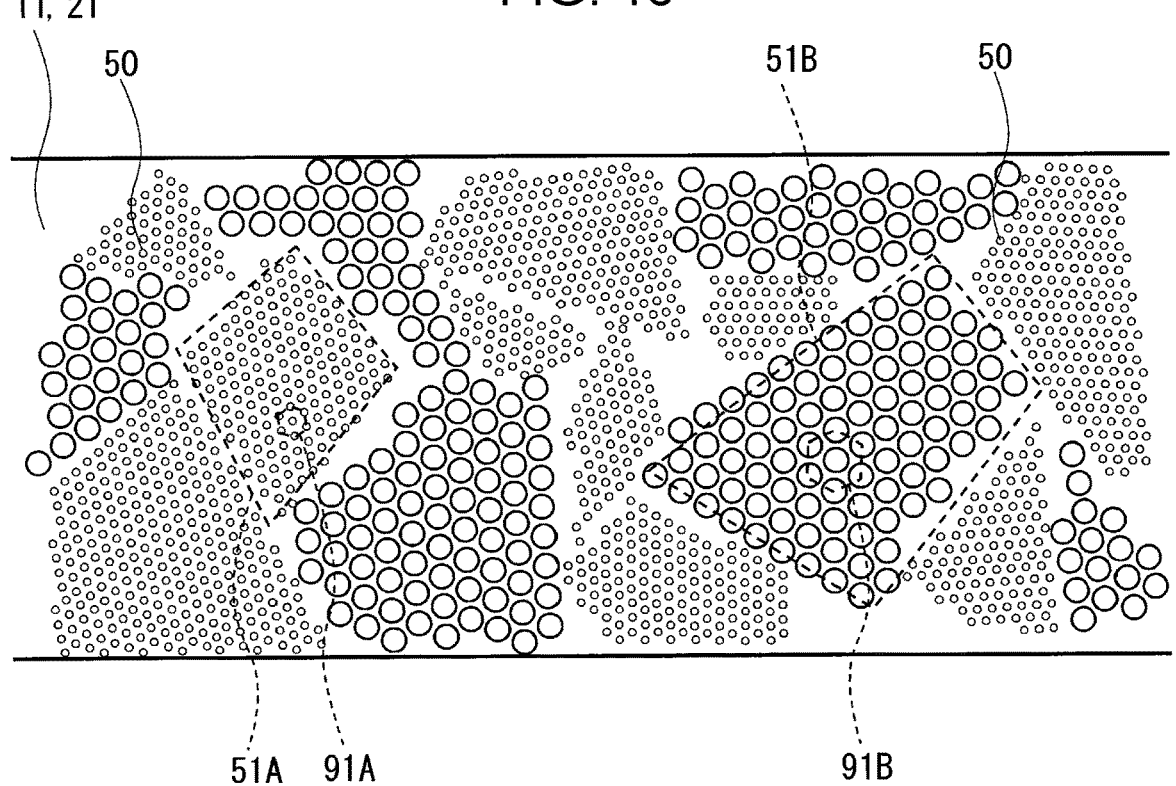
FIG. 16 is a plan view schematically showing still another example of the phononic crystal structures that the multilayer body of the present disclosure can have.

A phononic crystal structure A shown in FIG. 16 includes a third domain 51A in which a plurality of through holes 50 having a smaller diameter D are regularly arranged with a smaller period P and a fourth domain 51b in which a plurality of through holes 50 having a larger diameter D are regularly arranged with a larger period P. The phononic crystal structure A in FIG. 16 includes a plurality of domains having different shapes in plan view and different unit cell orientations. In this configuration, the frequency band of a phononic band gap formed in the third domain 51A differs from the frequency band of a phononic band gap formed in the fourth domain 51B, and therefore the effect of reducing the thermal conductivity is particularly significant.

The first phononic crystal layer 11 and the second phononic crystal layer 21 each have, for example, a polygonal shape such as a triangular, square, or rectangular shape, a circular shape, an elliptical shape, or a combination thereof in plan view. However, the shape of the first phononic crystal layer 11 and the shape of the second phononic crystal layer 21 are not limited to the above examples.

The multilayer body 1 has, for example, a polygonal shape such as a triangular, square, or rectangular shape, a circular shape, an elliptical shape, or a combination thereof in plan view. However, the shape of the multilayer body 1 is not limited to the above examples. The multilayer body 1 may have a rectangular parallelepipedic or cubic shape because the thickness of the through holes included in the phononic crystal structures in the through direction can be increased.

The multilayer body 1 may include two or more first phononic crystal layers 11 and/or two or more second phononic crystal layers 21. The multilayer body 1 may further include a third phononic crystal layer having a third phononic crystal structure having a configuration different from those of the first phononic crystal structure and the second phononic crystal structure.

In the multilayer body 1 shown in FIG. 1, the first phononic crystal layer 11 is in direct contact with the second phononic crystal layer 21. However, in the multilayer body of the present disclosure, another layer and/or a member may be disposed between the first phononic crystal layer 11 and the second phononic crystal layer 21. Examples of the other layer include an oxide layer such as a $SIO_2$ film.

The multilayer body of the present disclosure may include any layer other than those described above and/or any member. Examples of the member include a base substrate. In one possible configuration of the multilayer body of the present disclosure, the first phononic crystal layer 11 and the second phononic crystal layer 21 are disposed on a base substrate.

The base substrate is typically formed of a semiconductor. The semiconductor is, for example, Si. An oxide film may be formed on the upper surface of the base substrate formed of Si. The oxide film is, for example, a $SiO_2$ film. The structure of the base substrate is not limited to the above example.

Figure 17A:
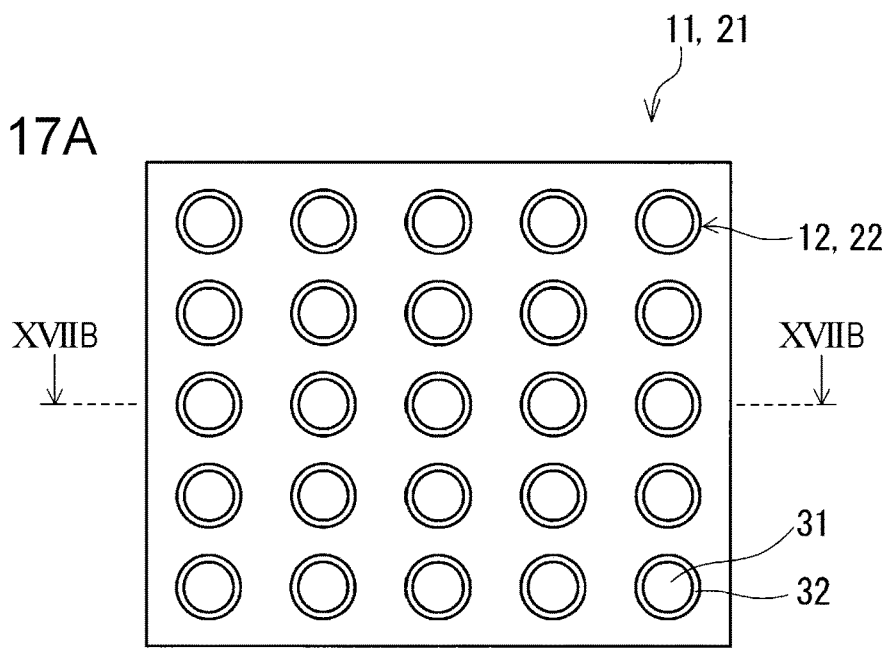
FIG. 17A is a plan view schematically showing an example of a phononic crystal layer that the multilayer body of the present disclosure can have.
Figure 17B:
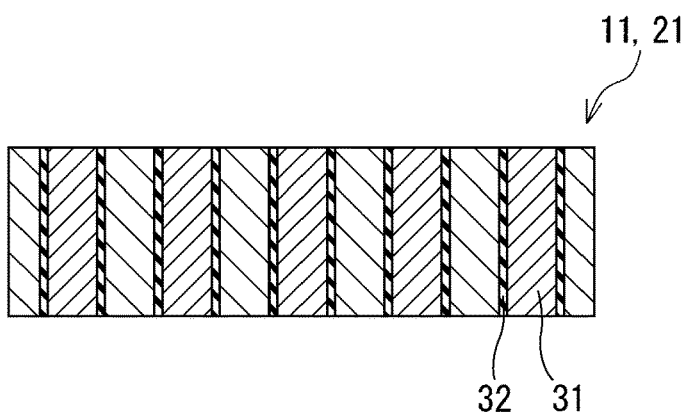
FIG. 17B is a cross-sectional view showing a cross section XVIIB-XVIIB of the phononic crystal layer in FIG. 17A.

Another example of the first phononic crystal layer 11 and the second phononic crystal layer 21 that differs from the above examples is shown in FIGS. 17A and 17B. FIG. 17B shows a cross section XVIIB-XVIIB of the phononic crystal layer 11 or 21 in FIG. 17A. The phononic crystal layer 11 or 21 shown in FIGS. 17A and 17B further includes a plurality of pillars 31. The pillars 31 are columnar members extending linearly. Each of the pillars 31 is filled into a corresponding one of the thorough holes 12 or 22 of the phononic crystal layer 11 or 21. The circumferential surface of each pillar 31 is covered with an oxide film 32. In this configuration, the through holes 12 or 22 that are vacant holes are filled with the respective pillars 31. Therefore, for example, flexibility in controlling the characteristics of the through holes 12 or 22 in the through direction in the multilayer body 1 can be increased. More specifically, for example, when the first phononic crystal layer 11 and the second phononic crystal layer 21 are formed of a semiconductor material having electric conductivity, the electron conductivity between these layers can be improved.

At least one phononic crystal layer selected from the first phononic crystal layer 11 and the second phononic crystal layer 21 may include pillars 31. In other words, the multilayer body of the present disclosure may further include a plurality of pillars 31, and each of the pillars 31 may be filled into a corresponding one of the first through holes 12 of the first phononic crystal layer 11 and/or the second through holes 22 of the second phononic crystal layer 21.

When the pillars 31 and the first phononic crystal layer 11 and/or the second phononic crystal layer 21 with the pillars 31 filled thereinto are formed of the same material, the circumferential surface of each pillar 31 is covered with the oxide film 32. When the pillars 31 and the first phononic crystal layer 11 and/or the second phononic crystal layer 21 with the pillars 31 filled thereinto are formed of different materials, the oxide film 32 is not always necessary.

Typically, the pillars 31 are formed of a semiconductor material. The material forming the pillars 31 is, for example, Si, SiGe, SiC, TlN, SiN, or $VO_2$. However, the material forming the pillars 31 is not limited to the above examples.

The oxide film 32 is, for example, a $SiO_2$ film. However, the oxide film 32 is not limited to the above example.

Figure 18:
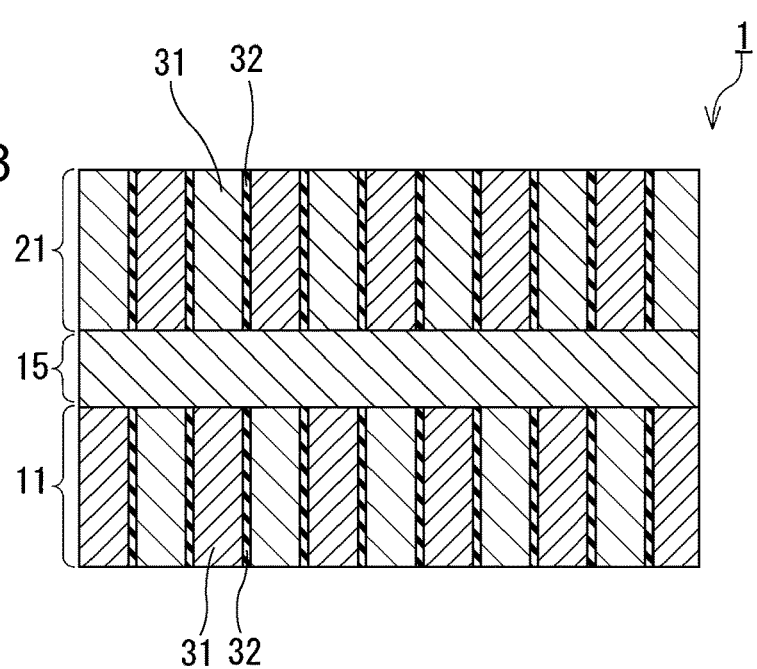
FIG. 18 is a cross-sectional view schematically showing an example of the multilayer body of the present disclosure.

An example of the multilayer body 1 including the first phononic crystal layer 11 with pillars 31 filled thereinto and the second phononic crystal layer 21 with pillars 31 filled thereinto is shown in FIG. 18. The multilayer body 1 in FIG. 18 includes the first phononic crystal layer 11 and the second phononic crystal layer 21 shown in FIGS. 17A and 17B. The multilayer body 1 in FIG. 18 has a two-layer structure including the two phononic crystal layers. A buffer layer 15 is disposed between the first phononic crystal layer 11 and the second phononic crystal layer 21. The material forming the pillars 31 (excluding the oxide film 32) in the second phononic crystal layer 21 is the same as the material forming the buffer layer 15. The material forming the buffer layer 15 is the same as the material forming the first phononic crystal layer 11 (excluding the pillars 31).

Figure 19A:
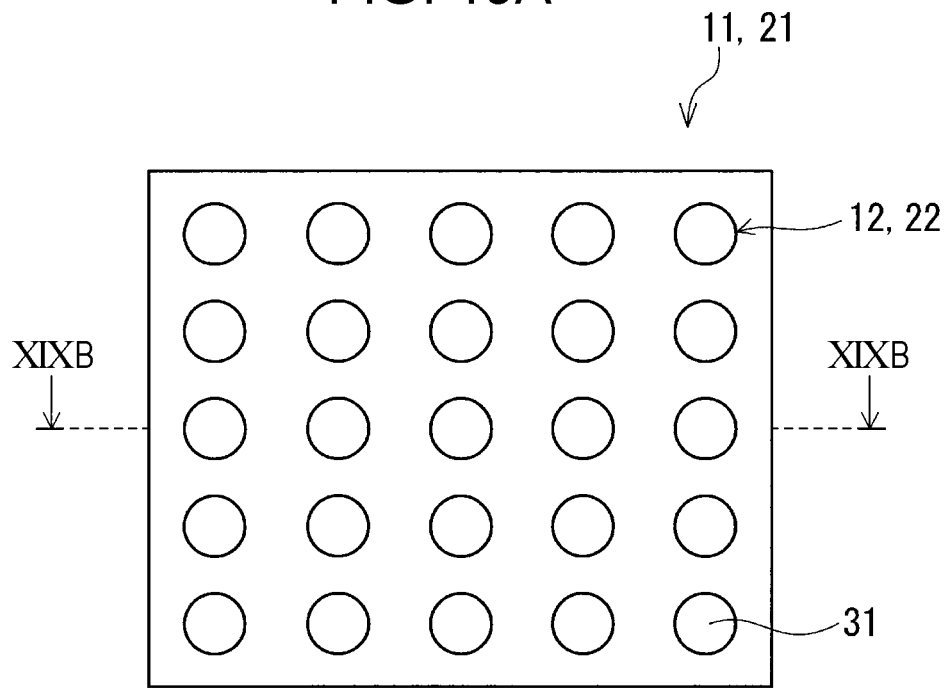
FIG. 19A is a plan view schematically showing another example of the phononic crystal layer that the multilayer body of the present disclosure can have.
Figure 19B:
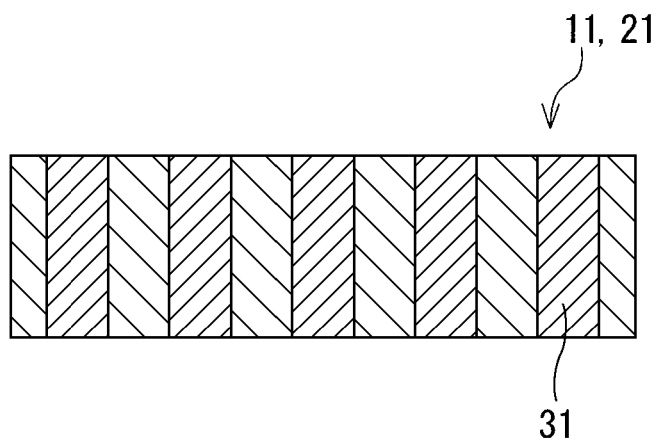
FIG. 19B is a cross-sectional view showing a cross section XIXB-XIXB of the phononic crystal layer in FIG. 19A.

Another example of the first phononic crystal layer 11 and the second phononic crystal layer 21 that differs from the above example is shown in FIGS. 19A and 19B. FIG. 19B shows a cross section XIXB-XIXB of the phononic crystal layer 11 or 21 in FIG. 19A. The phononic crystal layer 11 or 21 shown in FIG. 19A and FIG. 19B further includes a plurality of pillars 31. Each of the pillars 31 is filled into a corresponding one of the through holes 12 or 22 of the phononic crystal layer 11 or 21. The material forming the pillars 31 differs from the material forming the phononic crystal layer 11 or 21.

Figure 20:
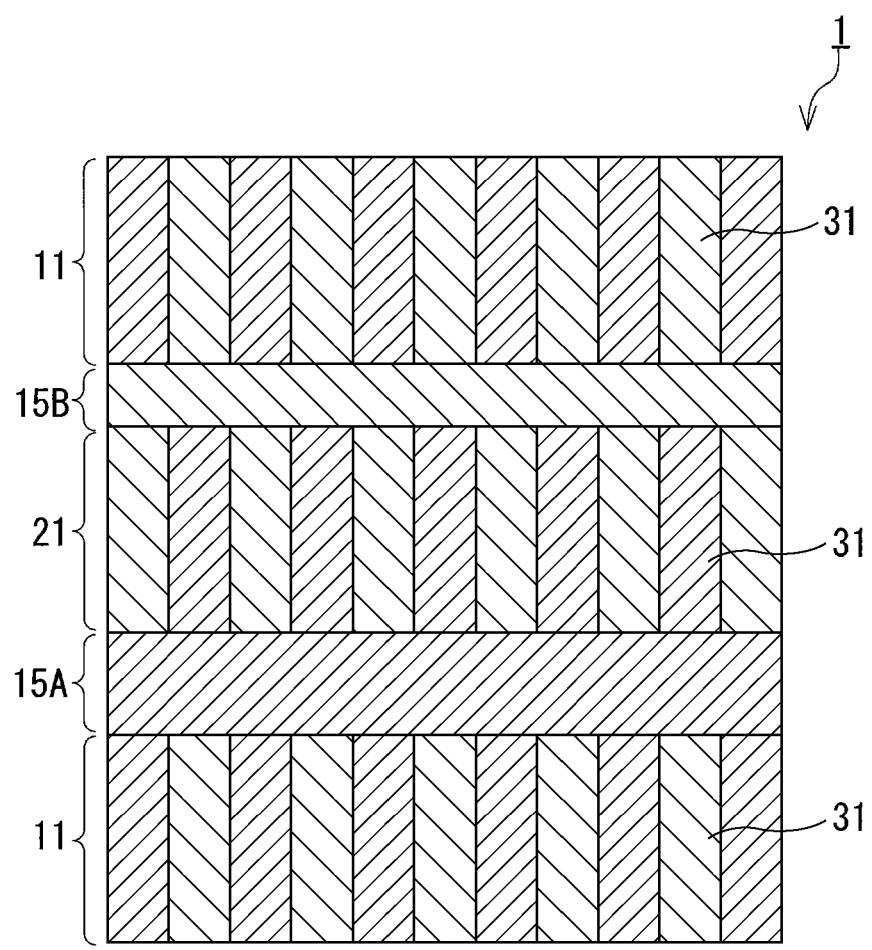
FIG. 20 is a cross-sectional view schematically showing another example of the multilayer body of the present disclosure.

An example of the multilayer body 1 including the first phononic crystal layers 11 with pillars 31 filled thereinto and the second phononic crystal layer 21 with the pillars 31 filled thereinto is shown in FIG. 20. The multilayer body 1 in FIG. 20 has a three-layer structure including three phononic crystal layers, i.e., a first phononic crystal layer 11, the second phononic crystal layer 21, and another first phononic crystal layer 11 that are disposed in this order. A first buffer layer 15A is disposed between the lowermost first phononic crystal layer 11 and the second phononic crystal layer 21. A second buffer layer 15B is disposed between the second phononic crystal layer 21 and the uppermost first phononic crystal layer 11. The material forming the pillars 31 in the first phononic crystal layers 11 is the same as the material forming the second buffer layer 15B. The material forming the second buffer layer 15B is the same as the material forming the second phononic crystal layer 21 (excluding the pillars 31). The material forming the pillars 31 in the second phononic crystal layer 21 is the same as the material forming the first buffer layer 15A. The material forming the first buffer layer 15A is the same as the material forming the first phononic crystal layers 11 (excluding the pillars 31). The multilayer body 1 shown in FIG. 20 is formed from two types of materials. The two types of materials may be semiconductor materials.

The multilayer body of the present disclosure can be produced using a combination of any of various thin film forming methods such as chemical vapor deposition (CVD), sputtering, and vapor deposition and any of various micromachining methods and pattern forming methods such as electron beam lithography, photolithography, block copolymer lithography, selective etching, and chemo-mechanical polishing (CMP). The block copolymer lithography is suitable for the formation of the phononic crystal structures.

An example of a method for producing the multilayer body of the present disclosure will be described with reference to FIGS. 21A to 21J. However, the method for producing the multilayer body of the present disclosure is not limited to the following example.

Figure 21A:
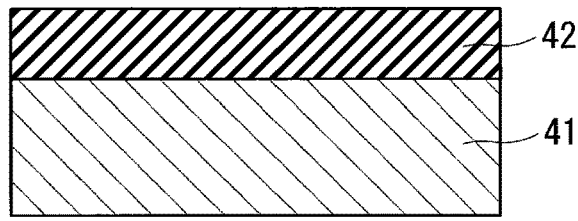
FIG. 21A is a schematic cross-sectional view illustrating an example of a method for producing the multilayer body of the present disclosure.

FIG. 21A: A base substrate 41 is prepared. An oxide film 42 has been provided on the upper surface of the base substrate 41. The oxide film 42 is, for example, a $SiO_2$ film.

Figure 21B:
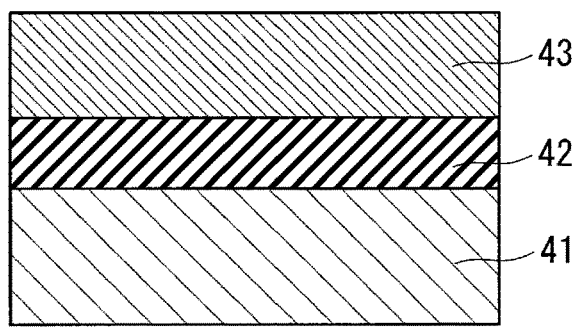
FIG. 21B is a schematic cross-sectional view illustrating the example of the method for producing the multilayer body of the present disclosure.

FIG. 21B: A semiconductor layer 43 is formed on the oxide film 42. The semiconductor layer 43 is, for example, a polycrystalline Si layer. The semiconductor layer 43 is formed, for example, by CVD. The thickness of the semiconductor layer 43 is, for example, 200 nm.

Figure 21C:
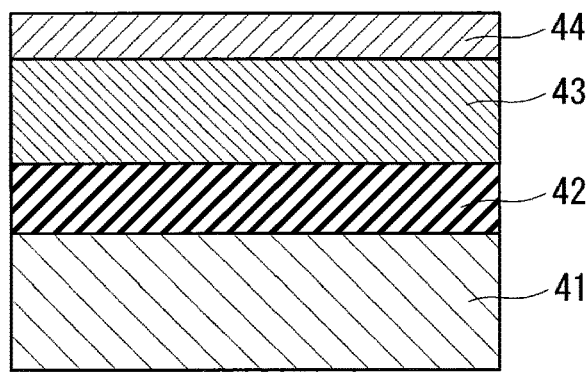
FIG. 21C is a schematic cross-sectional view illustrating the example of the method for producing the multilayer body of the present disclosure.

FIG. 21C: A hard mask 44 is formed on the semiconductor layer 43. The hard mask 44 is, for example, a $SiO_2$ layer. The hard mask 44 is formed, for example, by CVD. The thickness of the hard mask 44 is, for example, 30 nm. The hard mask 44 is used to form a phononic crystal structure in the semiconductor layer 43.

Figure 21D:
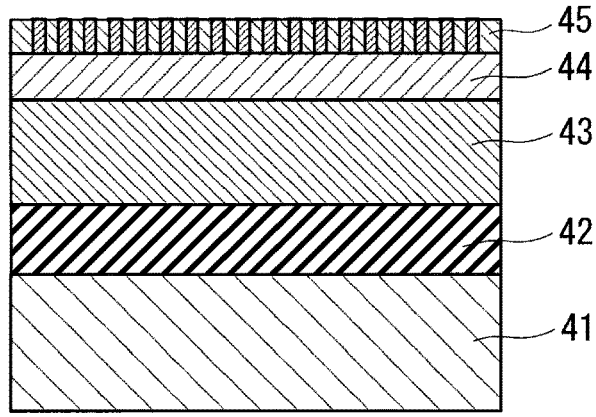
FIG. 21D is a schematic cross-sectional view illustrating the example of the method for producing the multilayer body of the present disclosure.

FIG. 21D: A self-assembled film 45 of a block copolymer is formed on the hard mask 44. The self-assembled film 45 is used for block copolymer lithography for forming a phononic crystal structure.

Figure 21E:
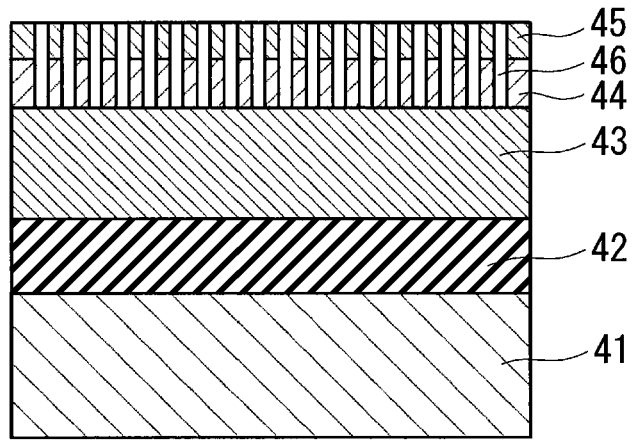
FIG. 21E is a schematic cross-sectional view illustrating the example of the method for producing the multilayer body of the present disclosure.

FIG. 21E: A plurality of regularly arranged through holes 46 are formed in the hard mask 44 by block copolymer lithography.

Figure 21F:
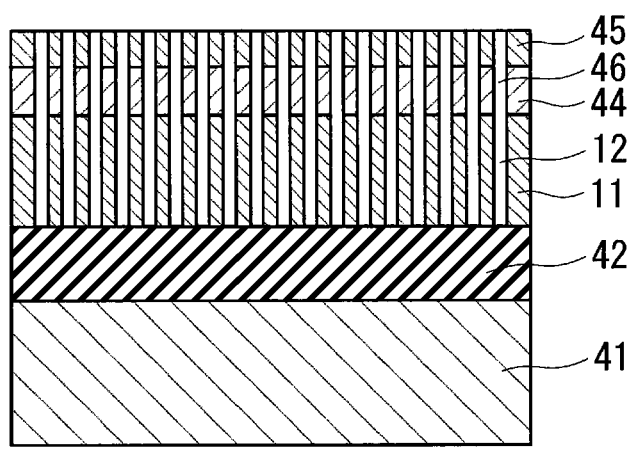
FIG. 21F is a schematic cross-sectional view illustrating the example of the method for producing the multilayer body of the present disclosure.

FIG. 21F: A plurality of regularly arranged through holes 12 are formed in the semiconductor layer 43 by selective etching using the hard mask 44 as a resist at positions corresponding to the plurality of through holes 46 in plan view. The plurality of through holes 12 form a phononic crystal structure. The semiconductor layer 43 later becomes the first phononic crystal layer 11.

Figure 21G:
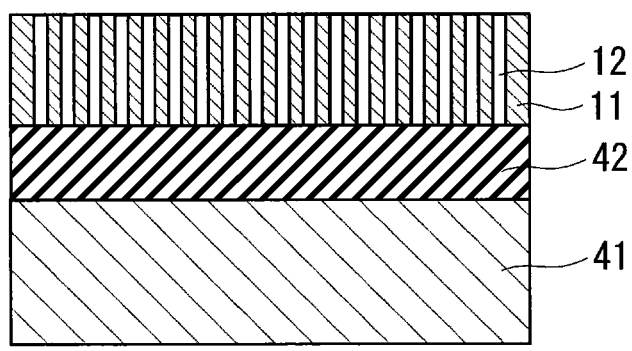
FIG. 21G is a schematic cross-sectional view illustrating the example of the method for producing the multilayer body of the present disclosure.

FIG. 21G: The hard mask 44 and the self-assembled film 45 are removed.

Figure 21H:
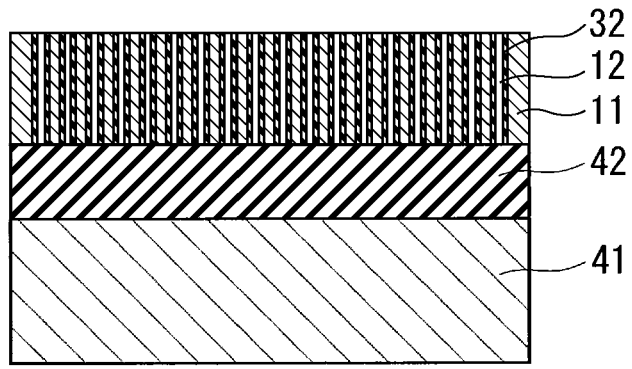
FIG. 21H is a schematic cross-sectional view illustrating the example of the method for producing the multilayer body of the present disclosure.

FIG. 21H: An oxide film 32 is formed on the inner circumferential surface of each of the through holes 12 in the first phononic crystal layer 11. The oxide film 32 is, for example, a $SiO_2$ film. The oxide film 32 is formed, for example, by thermal oxidation. The thickness of the oxide film 32 is, for example, 1 nm.

Figure 21I:
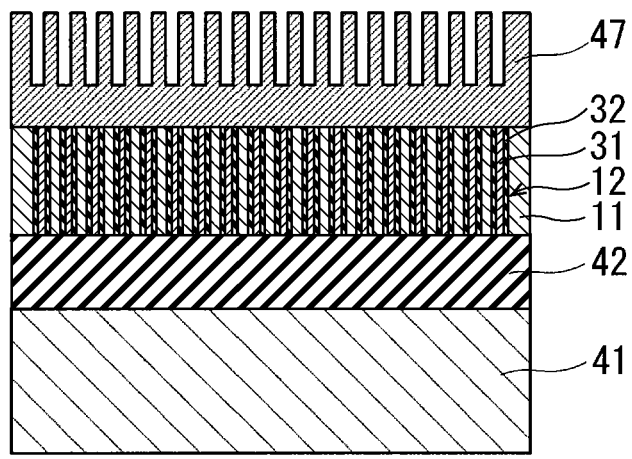
FIG. 21I is a schematic cross-sectional view illustrating the example of the method for producing the multilayer body of the present disclosure.

FIG. 21I: The through holes 12 in the first phononic crystal layer 11 are filled with a semiconductor to form pillars 31 having the oxide film 32 on their circumferential surface. The pillars 31 are formed of, for example, polycrystalline Si. The pillars 31 are formed, for example, by CVD. In this case, a layer 47 formed of the semiconductor material forming the pillars 31 is formed on the first phononic crystal layer 11.

Figure 21J:
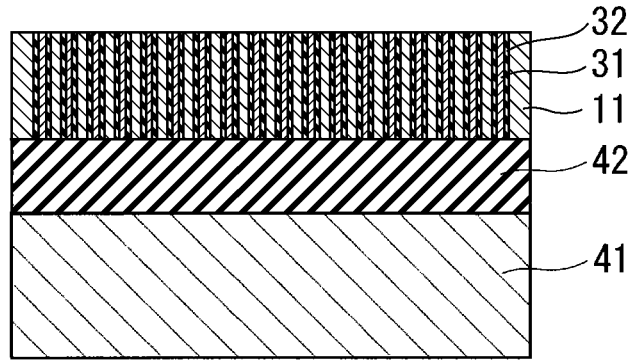
FIG. 21J is a schematic cross-sectional view illustrating the example of the method for producing the multilayer body of the present disclosure.

FIG. 21J: The layer 47 is removed by a method such as CMP. In this manner, the first phononic crystal layer 11 further including the pillars 31 is formed. Then a semiconductor layer 43 is further formed on the first phononic crystal layer 11, and the steps shown in FIGS. 21C to 21J are repeated. The second phononic crystal layer 21 can thereby be formed. The multilayer body 1 including the first phononic crystal layer 11 and the second phononic crystal layer 21 is obtained in the manner described above. By controlling the CMP in the step shown in FIG. 21J such that part of the layer 47 remains on the first phononic crystal layer 11, a multilayer body 1 including a buffer layer 15 can be obtained.

The thickness of the buffer layer 15 is, for example, equal to or less than 100 nm. The first phononic crystal layer 11 is connected to the second phononic crystal layer 21 with the thin buffer layer 15 therebetween. In this case, the effect of dispersing heat by interfaces 55 is obtained, and a mismatch in the velocity of sound between the buffer layer 15 and the phononic crystal layers 11 and 22 can reduce propagation of phonons across their interfaces. Therefore, the effect of further reducing the thermal conductivity can be expected.

[Crystalline Body]

The phononic crystal layers 11 or 21 shown in FIGS. 17A and 17B and FIG. 19A and FIG. 19B are novel crystalline bodies. The present disclosure includes the following crystalline body having a phononic crystal structure. The crystalline body includes a phononic crystal layer and a plurality of pillars. The phononic crystal layer has the phononic crystal structure having a plurality of regularly arranged through holes. The pillars are columnar bodies extending linearly. Each of the pillars is filled into a corresponding one of the through holes. When the phononic crystal layer and the pillars are formed of the same material, the circumferential surface of each pillar is covered with an oxide film. This crystalline body may be a monolayer structural body including one phononic crystal layer.

The multilayer body of the present disclosure is applicable, for example, to various applications in which the characteristics of the phononic crystal structure, typically its low thermal conductivity, are advantageous.

What is claimed is:

1. A multilayer body, comprising:
   a first phononic crystal layer; and
   a second phononic crystal layer disposed on or above the first phononic crystal layer,
   wherein the first phononic crystal layer has a first phononic crystal structure including a plurality of first through holes, which are regularly arranged,
   wherein the second phononic crystal layer has a second phononic crystal structure including a plurality of second through holes, which are regularly arranged,
   wherein a through direction of the plurality of first through holes in the first phononic crystal layer is substantially parallel to a through direction of the plurality of second through holes in the second phononic crystal layer,
   wherein the first phononic crystal structure includes a first domain and a second domain that are phononic crystal regions,
   wherein the first domain includes some of the plurality of first through holes that are regularly arranged in a first direction in a cross section perpendicular to the through direction of the first through holes,
   wherein the second domain includes some of the plurality of first through holes that are regularly arranged in a second direction different from the first direction in the cross section perpendicular to the through direction of the plurality of first through holes,
   wherein the second phononic crystal structure includes a third domain and a fourth domain that are phononic crystal regions,
   wherein the third domain includes some of the plurality of second through holes that are regularly arranged in a third direction in a cross section perpendicular to the through direction of the plurality of second through holes, and
   wherein the fourth domain includes some of the plurality of second through holes that are regularly arranged in a fourth direction different from the third direction in the cross section perpendicular to the through direction of the plurality of second through holes.

2. The multilayer body according to claim 1, wherein the first phononic crystal layer is in contact with the second phononic crystal layer.

3. The multilayer body according to claim 1, wherein at least part of the plurality of second through holes are not in communication with the plurality of first through holes.

4. The multilayer body according to claim 1, wherein the first phononic crystal layer and the second phononic crystal layer are each formed of a semiconductor material.

5. The multilayer body according to claim 1,
   wherein the first phononic crystal structure includes a fifth domain that is a phononic crystal region,
   wherein the second phononic crystal structure includes a sixth domain that is a phononic crystal region,
   wherein the fifth domain and the sixth domain overlap each other in the through direction of the plurality of first through holes or the plurality of second through holes, and
   wherein a period of the arrangement of the plurality of first through holes in the fifth domain differs from a period of the arrangement of the plurality of second through holes in the sixth domain.

6. The multilayer body according to claim 1, wherein the first phononic crystal structure includes a fifth domain that is a phononic crystal region,
   wherein the second phononic crystal structure includes a sixth domain that is a phononic crystal region,
   wherein the fifth domain and the sixth domain overlap each other in the through direction of the plurality of first through holes or the plurality of second through holes, and
   wherein a diameter of the plurality of first through holes in the fifth domain differs from a diameter of the plurality of second through holes in the sixth domain.

7. The multilayer body according to claim 1,
   wherein the first phononic crystal structure includes a fifth domain that is a phononic crystal region,
   wherein the second phononic crystal structure includes a sixth domain that is a phononic crystal region,
   wherein the fifth domain and the sixth domain overlap each other in the through direction of the plurality of first through holes or the plurality of second through holes, and
   wherein a type of unit cell including some of the plurality of first through holes in the fifth domain differs from a type of unit cell including some of the plurality of second through holes in the sixth domain.

8. The multilayer body according to claim 1, further comprising a buffer layer disposed between the first phononic crystal layer and the second phononic crystal layer,
   wherein the buffer layer is formed of the same material as the material of the first phononic crystal layer and the second phononic crystal layer.

9. A multilayer body, comprising:
   a first phononic crystal layer;
   a second phononic crystal layer stacked on or above the first phononic crystal layer in a stacking direction; and a plurality of pillars, wherein:
the first phononic crystal layer has a first phononic crystal structure including a plurality of first through holes, which are regularly arranged,
the second phononic crystal layer has a second phononic crystal structure including a plurality of second through holes, which are regularly arranged,
a through direction of the plurality of first through holes in the first phononic crystal layer is substantially parallel to a through direction of the plurality of second through holes in the second phononic crystal layer and substantially parallel to the stacking direction,
the plurality of pillars are columnar bodies extending linearly,
each of the plurality of pillars is filled into a corresponding one of the plurality of first through holes in the first phononic crystal layer and/or the plurality of second through holes in the second phononic crystal layer,
the plurality of pillars and the first phononic crystal layer and/or the second phononic crystal layer with the plurality of pillars filled thereinto are formed of the same material, and
a circumferential surface of each of the plurality of pillars is covered with an oxide film.

10. The multilayer body according to claim 9, wherein each of the plurality of pillars has been filled into a corresponding one of the plurality of first through holes and the plurality of second through holes.

11. The multilayer body according to claim 9, wherein the plurality of pillars are formed of a semiconductor material.

* * * * *